United States Patent [19]
Chung et al.

[11] Patent Number: 5,901,106
[45] Date of Patent: May 4, 1999

[54] DECODER CIRCUIT USING REDUNDANCY SIGNAL HAVING A SHORT PULSE FORMAT

[75] Inventors: Min-Chul Chung, Ahnsan; Jong-Young Kim, Seoul, both of Rep. of Korea

[73] Assignee: Samsung Electronics, Co., Ltd., Suwon, Rep. of Korea

[21] Appl. No.: 08/961,049

[22] Filed: Oct. 30, 1997

[30] Foreign Application Priority Data

Oct. 30, 1996 [KR] Rep. of Korea ............ 96-50271

[51] Int. Cl.⁶ ............................................ G11C 8/00
[52] U.S. Cl. ................ 365/230.06; 365/200; 365/233
[58] Field of Search ................ 365/230.06, 200, 365/233

[56] References Cited

U.S. PATENT DOCUMENTS

| | | | |
|---|---|---|---|
| 5,383,156 | 1/1995 | Komatsu | 365/230.06 |
| 5,469,388 | 11/1995 | Park | 365/230.06 |
| 5,528,540 | 6/1996 | Shibata et al. | 365/230.06 |

*Primary Examiner*—Son T. Dinh
*Attorney, Agent, or Firm*—Marger Johnson, & McCollom P.C.

[57] ABSTRACT

Disclosed is a decoder circuit including: a redundancy section row decoder for responding a redundancy main word line signal, thereby selecting a redundancy section word line; a normal section row decoder for receiving a redundancy signal and a normal main word line signal applied from a row redundancy address decoder, thereby selecting a section word line; and, a row redundancy address decoder for generating a signal having a pulse width up to before a next cycle following a redundancy cycle as a redundancy signal, thereby providing the signal to the normal section row decoder and providing the redundancy main word line signal to the redundancy section row decoder during the redundancy cycle, in response to a clock transiting in the redundancy cycle.

9 Claims, 6 Drawing Sheets

DECODER CIRCUIT USING REDUNDANCY SIGNAL HAVING A SHORT PULSE FORMAT

BACKGROUND OF THE INVENTION

1. Field of the Invention

The present invention relates to a circuit applicable to a semiconductor memory device, and in particular, to a decoder circuit which is capable of generating a redundancy signal having a short pulse format, and controlled by the generated signal.

2. Description of the Related Art

Conventionally, a volatile semiconductor memory device has a redundancy repairing scheme for disabling a normal word line or a column pass by use of a signal. A word line redundancy repairing scheme controls an enabling operation or a disabling operation of a section word line decoder by applying a redundancy signal to the section word line decoder which receives a main word line signal, and then in turn generates a signal to select a section word line.

In the prior art, however, it is difficult to rapidly perform the enabling operation of the normal word line because of a static transition of the redundancy signal, which increases the signal load and/or slows the transition speed. FIG. 1 showing timing diagram having clock XCK illustrates the redundancy cycle of the prior art. The enabling speed of a cycle 22A proceeded by a redundancy cycle 101 of the normal word line in the prior art is reduced by that proceeding redundancy cycle 101 itself. That is, here, the enabling speed of the normal word line 22A is interrupted via a line path 1. As a result, because of increase of the load or a reduction of a transition speed, the prior art has a disadvantage in that an enabling speed of a normal word line 22A is easily interrupted.

In the prior art as shown in FIG. 2, a row redundancy address decoder 300, more specifically includes a programmable fuse box 301 and lines 10 and 11 for providing a redundancy main word line signal and a redundancy signal respectively. Row redundancy address decoder 300 includes inverters 302 and 303 and node "A" which is transited from the logic "low" level state to the logic "high" level state during redundancy access, that is node "A" is enabled to the "high" level state during the redundancy access.

In the above redundancy repairing scheme, a redundancy word line of an address to be repaired or a redundancy column selection line thereof instead should be rapidly enabled. Simultaneously, a normal word line or a normal column pass should be rapidly enabled by a specific signal. Additionally, in a case where the address to enable the normal word line or the column pass in a next cycle is inputted after the enabled redundancy word line or the redundancy column pass performs its operation, a signal not selecting the normal word line or the column pass in a previous cycle should be rapidly enabled, thereby preventing a cell connected to the normal word line or the column pass from being selected at a low speed. Therefore, what is needed is a redundancy repair scheme which avoids an increase in signal load and does not slow the transition speed.

SUMMARY OF THE INVENTION

It is therefore an object of the present invention to provide a decoder circuit of a semiconductor memory device capable of solving problems of a prior art semiconductor memory device.

It is another object of the present invention to provide a decoder circuit of a semiconductor memory device not interrupting an enabling speed of a normal word line.

To achieve the above objects, a decoder circuit of this invention includes a redundancy section row decoder for responding to a redundancy main word line signal, and thereby selecting a redundancy section word line; a normal section row decoder for receiving a redundancy signal and a normal main word line signal which is applied from a row redundancy address decoder, and thereby selecting a section word line; and, a row redundancy address decoder for generating a signal having a pulse width up to before a next cycle following a redundancy cycle as a redundancy signal, thereby providing the signal to the normal section row decoder and in addition providing the redundancy main word line signal to the redundancy section row decoder during the redundancy cycle, in response to a clock transiting in the redundancy cycle. Accordingly, the row redundancy address decoder of this invention for generating a signal having a pulse width up to before a next cycle, generates a pulse for performing a disabling operation.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

In the following description, numeral specific details such as components and frequencies of the concrete circuit, are set forth to provide a more thorough understanding of the present invention. It will be apparent, however, to one skilled in the art that the present invention may be practiced without these specific details. The detailed description of known function and constructions unnecessarily obscuring the subject matter of the present invention will be avoided in the present invention. Now, a preferred embodiment of the present invention will be described in detail with reference to the accompanying drawings.

This invention is a method and apparatus for providing redundancy repair scheme which avoids an increase in signal load and does not slow the transition speed by providing a pulse for performing a disabling operation.

Figure 3:
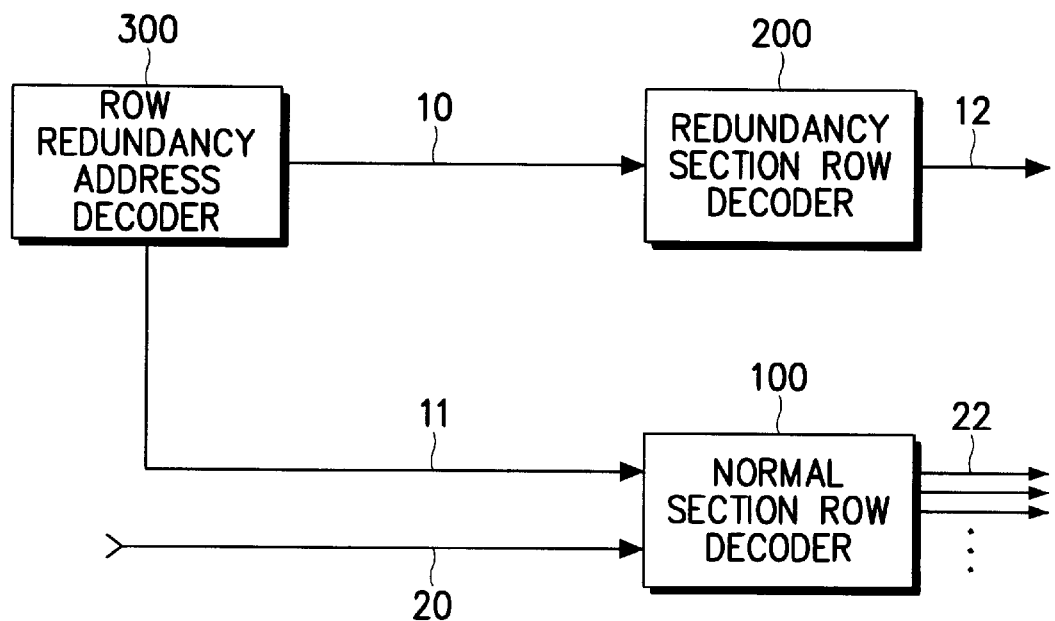
FIG. 3 is a block diagram showing a decoder circuit according to the present invention.

FIG. 3 is a block diagram showing a decoder circuit according to the present invention, including a row redundancy address decoder 300, a redundancy section row decoder 200, and a normal section row decoder 100. The redundancy section row decoder 200 responds a redundancy main word line signal applied through a line 10, thereby generating a signal 12A selecting a redundancy section word line via a line 12. The normal section row decoder 100 receives a normal main word line signal which is applied from the row redundancy address decoder 300 via a line 20 and a redundancy signal 11A provided via a line 11, to generate a signal 22A selecting a section word line via a line 22. The row redundancy address decoder 300 responds a clock XCK transiting in a redundancy cycle, thereby providing the redundancy signal representing repairing information to the normal section row decoder 100. Here, the redundancy signal has a pulse width up to before a next cycle following the redundancy cycle as shown in FIG. 3 discussed below. Additionally, during the redundancy cycle, the row redundancy address decoder 300 provides the redundancy main word line signal to the redundancy section row decoder 200 via the line 10.

Figure 4:
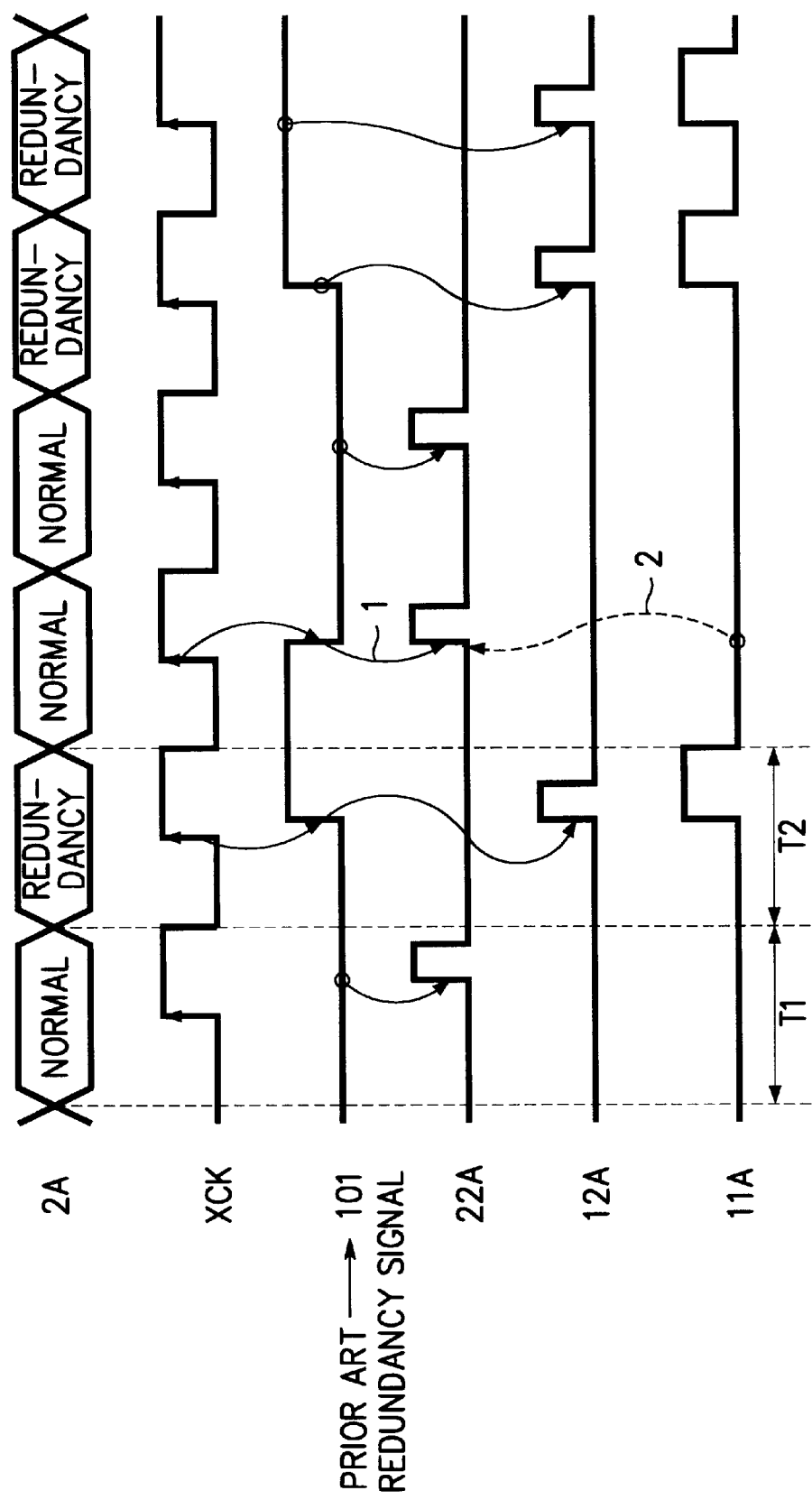
FIG. 4 is a timing diagram showing a redundancy signal according to an embodiment of the present invention and a prior art.
Figure 5:
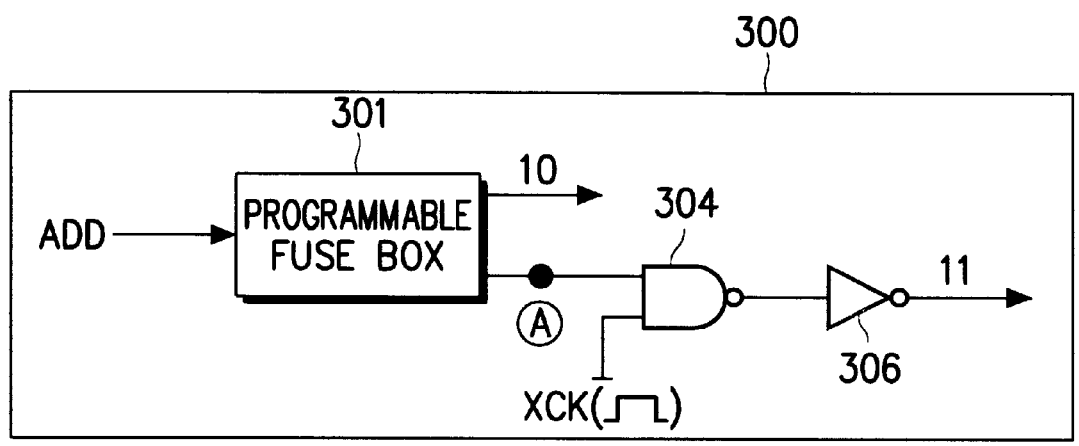
FIG. 5 is a diagram of the row redundancy address decoder of this invention.

Referring now to FIG. 4 in order to explain a principle of the present invention in detail, FIG. 4 is a timing diagram showing a redundancy signal 11A according to an embodiment of the present invention and also the prior art first discussed with reference to FIG. 1. In FIG. 4, it is assumed that the redundancy cycle has three cycles and that the XCK waveform represents the timing clock. Briefly turning to FIG. 5, a figure distinguishing the prior art of FIG. 2 from this invention, it can be seen that row redundancy address decoder includes NAND gate 304 which operates to receive clock signal XCK which outputs a signal to inverter 306.

As mentioned above, the row redundancy address decoder 300 provides the waveform representative of signal 13A to the normal section row decoder 100 via the line 11. In the present invention, when providing the redundancy signal 11A via the line 11, a short pulse, such as a waveform representing signal 11A as shown in FIG. 4 is provided. High sections of the waveform 11A exist in the only redundancy cycles contrary to the prior art waveform 101. Therefore, the normal section row decoder 100 responds via a line path 2 of FIG. 4, and generates a signal to enable the normal section word line as shown in a waveform representing signal 22A of FIG. 4 via line 22. As discussed above, the prior art applies the redundancy signal represented by waveform 101 to the normal section row decoder so that the normal word line is interrupted via line path 1. Here, however, according to this invention, the waveform representative of signal 11A has an outer edge at the end of T2, the dotted line 2 illustrating that the waveform representing signal 22A is beneficially not interrupted by signal 11A. In this manner, this invention provides a redundancy repair scheme which avoids an increase in signal load and does not slow the transition speed.

Figure 6:
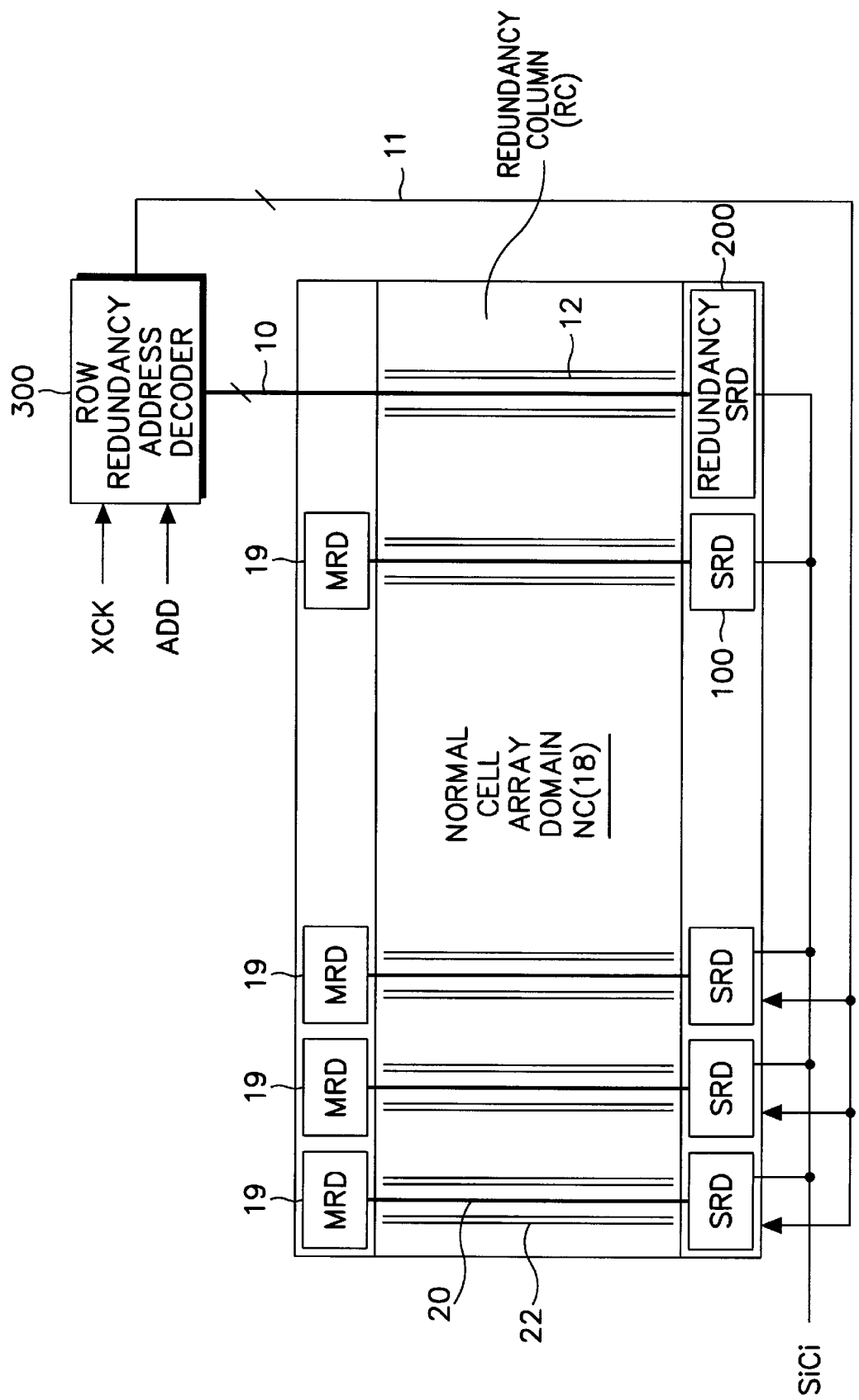
FIG. 6 is a view showing an arrangement of a row redundancy address decoder and a section word line decoder according to the present invention.

FIG. 6 is a view showing an arrangement of a row redundancy address decoder and a section word line decoder according to the present invention. A reference numeral 19 is a main word line decoder. A normal cell array domain 18 is arranged among the main word line decoders 19. The row redundancy address decoder 300 receives a clock XCK and an address ADD, thereby providing the redundancy main word line signal via the line 10 and the redundancy signal via the line 1. The redundancy signal is applied to a plurality of the normal section row decoders 100 (Normal SRD). A signal SiCi is an address signal mixing a block selection signal with a LSB signal of a row address.

Figure 1:
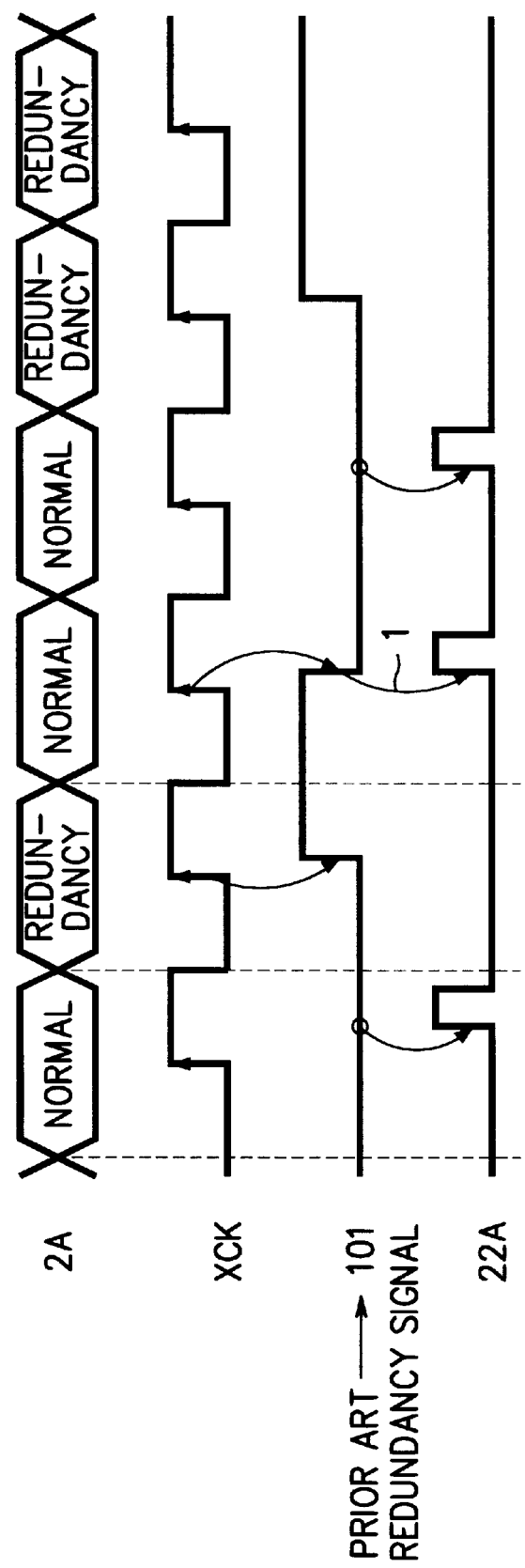
FIG. 1 is a timing diagram of the prior art.
Figure 2:
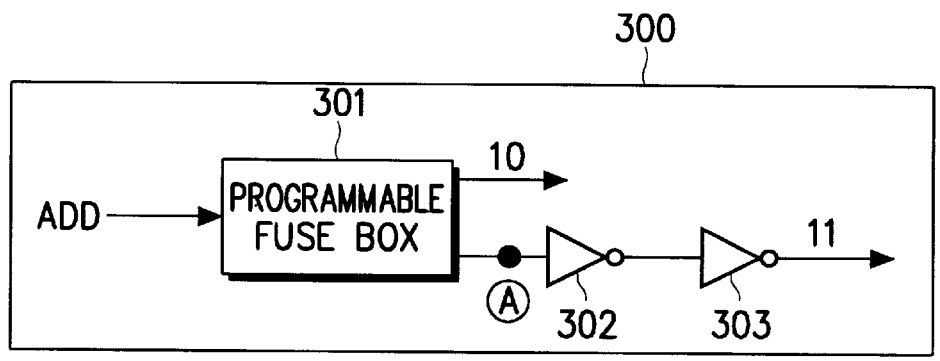
FIG. 2 is a diagram of a row redundancy address decoder of the prior art.
Figure 7:
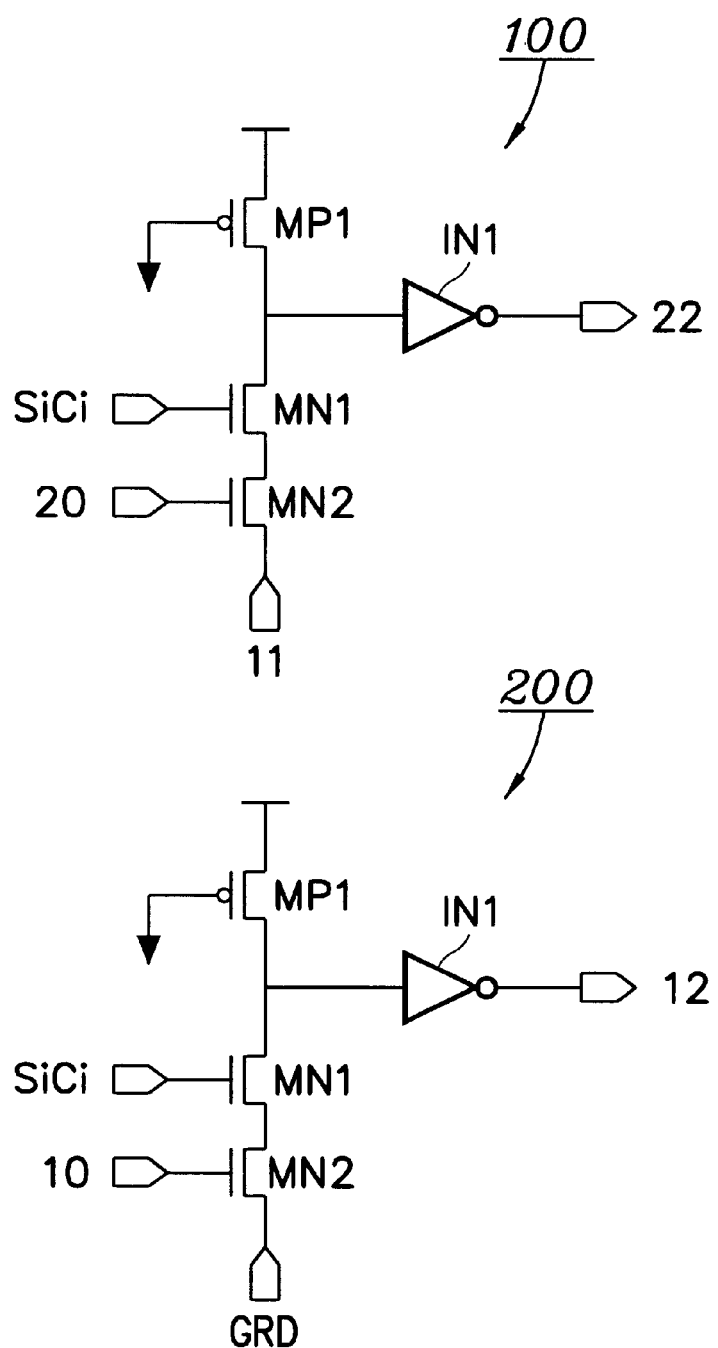
FIG. 7 is a circuit diagram concretely showing an embodiment of a normal section row decoder 100 and a redundancy section row decoder 200 as shown in FIG. 1.

FIG. 7 is a circuit diagram concretely showing an embodiment of the normal section row decoder 100 and the redundancy section row decoder (Redundancy SRD) 200 as shown in FIG. 1. The normal section row decoder 100 is comprised of a PMOS transistor MP1, NMOS transistors MN1 and MN2, and an inverter IN1. The signal SiCi is applied to a gate of the NMOS transistor MN1, the main word line signal is applied to a gate of the NMOS transistor MN2, and the redundancy signal is applied to a source of the above NMOS transistor MN2. An input terminal of the inverter IN1 is connected to a coupling point of a drain of the PMOS transistor MP1 with a drain of the NMOS transistor MN1, while an output terminal thereof is connected to the section word line in order to enable the normal section word line. Meanwhile, the redundancy section row decoder 200 is comprised of the PMOS transistor MP1, the NMOS transistors MN1 and MN2, and the inverter IN1, like the aforesaid the normal section row decoder 100. The signal SiCi is applied to the gate of the NMOS transistor MN1, the redundancy main word line signal is applied to the gate of the NMOS transistor MN2, and the source of the NMOS transistor MN2 is coupled to a ground. The input terminal of the inverter IN1 is connected to the coupling point of the drain of the PMOS transistor MP1 with the drain of the NMOS transistor MN1, while the output terminal thereof is connected to the redundancy section word line in order to enable the redundancy section word line.

As apparent from the foregoing, the present invention has an advantage in that a semiconductor memory device using a method for enabling a pulsed word line can provide a decoder circuit capable of rapidly performing an enabling operation of the word line, not interrupting the enabling speed of the normal word line even when repairing the redundancy word line.

While there have been illustrated and described what are considered to be preferred embodiments of the present invention, it will be understood by those skilled in the art that various changes and modifications may be made, and equivalents made be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiments disclosed as the best mode contemplated for carrying out the present invention, but that the present invention includes all embodiments falling within the scope of the appended claims.

What is claimed is:

1. A decoder circuit of a synchronous memory device, comprising:
   a redundancy section row decoder being configured to respond to a redundancy main word line signal, said redundancy section row decoder being configured to select a redundancy section word line;
   a normal section row decoder being configured to receive a redundancy signal and a normal main word line signal applied from a row redundancy address decoder, said normal section row decoder being configured to select a section word line; and
   a row redundancy address decoder being configured to generate a redundancy signal having a pulse width up to before a next cycle following a redundancy cycle, said redundancy signal being applied to said normal section row decoder and said redundancy main word line signal being applied to said redundancy section row decoder during said redundancy cycle, in response to a clock transition in said redundancy cycle.

2. The decoder circuit according to claim 1 wherein said normal section row decoder is configured to receive said redundancy signal as a pulse for performing a disabling operation.

3. The decoder circuit according to claim 2, wherein said redundancy signal to disable said normal section row decoder is generated as a signal having a pulse width up to before a next cycle following said redundancy cycle and is set to a signal having said pulse width capable of fully disabling a pulsed word line.

4. A word line decoder circuit of a semiconductor memory device, comprising of:

a redundancy section row decoder configured to respond to a redundancy main word line signal, said redundancy section row decoder being configured to select a redundancy section word line;

a normal section row decoder being configured to receive a redundancy signal and a normal main word line signal applied from a row address decoder, said normal section row decoder being configured to select a section word line; and a row redundancy address decoder being configured to generate a redundancy signal having a pulse width up to before a next cycle following a redundancy cycle, said redundancy signal provided to said normal section row decoder and said redundancy main word line signal provided to said redundancy section row decoder during said redundancy cycle, in response to a clock transiting in said redundancy cycle.

5. The word line decoder circuit of a semiconductor memory device, according to claim 4, wherein said normal section row decoder is configured to receive said redundancy signal as a pulse for performing a disabling operation.

6. The word line decoder circuit of a semiconductor memory device, according to claim 5, wherein said redundancy signal to disable said normal section row decoder is generated as a signal having a pulse width up to before a next cycle following said redundancy cycle and is set to a signal having said pulse width capable of fully disabling a pulsed word line.

7. A method for providing a decoder circuit, comprising the steps of:

providing a redundancy section row decoder which is configured to respond to a redundancy main word line signal, said redundancy section row decoder being configured to select a redundancy section word line;

providing a normal section row decoder which is configured to receive a redundancy signal and a normal main word line signal applied from a row redundancy address decoder, said normal section row decoder being configured to select a section word line; and providing a row redundancy address decoder which is configured to generate a redundancy signal having a pulse width up to before a next cycle following a redundancy cycle, said redundancy signal being applied to said normal section row decoder and said redundancy main word line signal being applied to said redundancy section row decoder during said redundancy cycle, in response to a clock transiting in said redundancy cycle.

8. The method for providing a decoder circuit according to claim 7 wherein said normal section row decoder is configured to receive said redundancy signal as a pulse for performing a disabling operation.

9. The method for providing a decoder circuit according to claim 8, wherein said redundancy signal to disable said normal section row decoder is generated as a signal having a pulse width up to before a next cycle following said redundancy cycle and is set to a signal having said pulse width capable of fully disabling a pulsed word line.

* * * * *